(12) United States Patent
Umetsu et al.

(10) Patent No.: US 10,311,932 B2
(45) Date of Patent: Jun. 4, 2019

(54) MAGNETIC MEMORY DEVICE

(71) Applicant: Toshiba Memory Corporation, Tokyo (JP)

(72) Inventors: Nobuyuki Umetsu, Kawasaki Kanagawa (JP); Tsuyoshi Kondo, Kawasaki Kanagawa (JP); Yasuaki Ootera, Yokohama Kanagawa (JP); Takuya Shimada, Kawasaki Kanagawa (JP); Michael Arnaud Quinsat, Yokohama Kanagawa (JP); Masaki Kado, Kamakura Kanagawa (JP); Susumu Hashimoto, Nerima Tokyo (JP); Shiho Nakamura, Fujisawa Kanagawa (JP); Tomoya Sanuki, Suzuka Mie (JP); Yoshihiro Ueda, Yokohama Kanagawa (JP); Yuichi Ito, Yokkaichi Mie (JP); Shinji Miyano, Yokohama Kanagawa (JP); Hideaki Aochi, Yokkaichi Mie (JP); Yasuhito Yoshimizu, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/918,304

(22) Filed: Mar. 12, 2018

(65) Prior Publication Data

US 2019/0088305 A1 Mar. 21, 2019

(30) Foreign Application Priority Data

Sep. 19, 2017 (JP) .................................. 2017-178741

(51) Int. Cl.
*G11C 19/08* (2006.01)
*G11C 11/16* (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC .................. G11C 19/0841; G11C 19/0866
See application file for complete search history.

(56) References Cited

U.S. PATENT DOCUMENTS

2010/0008135 A1* 1/2010 Cho .................... G01R 33/12
365/171
2010/0315854 A1* 12/2010 Suzuki .................... H01L 43/08
365/87

(Continued)

FOREIGN PATENT DOCUMENTS

| JP | 2016-9806 A | 1/2016 |
|---|---|---|
| JP | 2017-59593 A | 3/2017 |
| JP | 2017-59595 A | 3/2017 |

*Primary Examiner* — Hoai V Ho
*Assistant Examiner* — Jay W. Radke
(74) *Attorney, Agent, or Firm* — Finnegan, Henderson, Farabow, Garrett & Dunner, L.L.P.

(57) ABSTRACT

According to one embodiment, a magnetic memory device includes a magnetic portion, a first magnetic layer, a first nonmagnetic layer, a first element portion, first to third interconnects, and a controller. In a first operation, the controller sets the first interconnect to a first potential, the second interconnect to a second potential, and the third interconnect to a third potential. An absolute value of a difference between the second potential and the third potential is greater than that between the first potential and the third potential. In a second operation, the controller sets the first interconnect to a fourth potential, the second interconnect to a fifth potential, and the third interconnect to a sixth potential. An absolute value of a difference between the fifth potential and the sixth potential is less than that between the fourth potential and the sixth potential.

20 Claims, 6 Drawing Sheets

(51) Int. Cl.
*H01L 27/22* (2006.01)
*H01L 23/528* (2006.01)
*H01F 10/32* (2006.01)
*H01L 43/08* (2006.01)
*H01L 43/10* (2006.01)
*H01L 43/02* (2006.01)

(52) U.S. Cl.
CPC ...... *G11C 19/0841* (2013.01); *G11C 19/0866* (2013.01); *H01L 23/528* (2013.01); *H01L 27/222* (2013.01); *H01F 10/329* (2013.01); *H01F 10/3254* (2013.01); *H01F 10/3286* (2013.01); *H01L 43/02* (2013.01); *H01L 43/08* (2013.01); *H01L 43/10* (2013.01)

(56) References Cited

U.S. PATENT DOCUMENTS

| | | | |
|---|---|---|---|
| 2011/0051490 A1* | 3/2011 | DeBrosse | G11C 8/10 365/80 |
| 2014/0097847 A1* | 4/2014 | Elgort | G01R 33/282 324/322 |
| 2015/0380638 A1 | 12/2015 | Ootera et al. | |
| 2017/0077174 A1 | 3/2017 | Kondo et al. | |

* cited by examiner

MAGNETIC MEMORY DEVICE

CROSS-REFERENCE TO RELATED APPLICATIONS

This application is based upon and claims the benefit of priority from Japanese Patent Application No. 2017-178741, filed on Sep. 19, 2017; the entire contents of which are incorporated herein by reference.

FIELD

Embodiments described herein relate generally to a magnetic memory device.

BACKGROUND

A magnetic memory device has been proposed in which information recorded in a magnetic wire is moved by moving domain walls. It is desirable to increase the storage density of the magnetic memory device.

DETAILED DESCRIPTION

According to one embodiment, a magnetic memory device includes a magnetic portion, a first magnetic layer, a first nonmagnetic layer, a first element portion, a first interconnect, a second interconnect, a third interconnect, and a controller. The magnetic portion includes a first portion, a second portion, and a third portion between the first portion and the second portion. The first nonmagnetic layer is provided between the first magnetic layer and the third portion. The first element portion includes a first semiconductor region of a first conductivity type, a second semiconductor region of the first conductivity type, and a third semiconductor region of a second conductivity type. The third semiconductor region is provided between the first semiconductor region and the second semiconductor region. The first semiconductor region is electrically connected to the second portion. The first interconnect is electrically connected to the first portion. The second interconnect is electrically connected to the second semiconductor region. The third interconnect is electrically connected to the first magnetic layer. The controller is electrically connected to the first interconnect, the second interconnect, and the third interconnect. In a first operation, the controller sets the first interconnect to a first potential, sets the second interconnect to a second potential, and sets the third interconnect to a third potential. An absolute value of a difference between the second potential and the third potential is greater than an absolute value of a difference between the first potential and the third potential. In a second operation, the controller sets the first interconnect to a fourth potential, sets the second interconnect to a fifth potential, and sets the third interconnect to a sixth potential. An absolute value of a difference between the fifth potential and the sixth potential is less than an absolute value of a difference between the fourth potential and the sixth potential.

According to another embodiment, a magnetic memory device includes a magnetic portion, a first magnetic layer, a first nonmagnetic layer, a second magnetic layer, a second nonmagnetic layer, a first element portion, a first interconnect, a second interconnect, a third interconnect, and a controller. The magnetic portion includes a first portion, a second portion, and a third portion between the first portion and the second portion. The first nonmagnetic layer is provided between the first magnetic layer and the third portion. The second nonmagnetic layer is provided between the second magnetic layer and the first portion. The first element portion includes a first semiconductor region of a first conductivity type, a second semiconductor region of the first conductivity type, and a third semiconductor region of a second conductivity type. The third semiconductor region is provided between the first semiconductor region and the second semiconductor region. The first semiconductor region is electrically connected to the second portion. The first interconnect is electrically connected to the second magnetic layer. The second interconnect is electrically connected to the second semiconductor region. The third interconnect is electrically connected to the first magnetic layer. The controller is electrically connected to the first interconnect, the second interconnect, and the third interconnect. In a first operation, the controller sets the first interconnect to a first potential, sets the second interconnect to a second potential, and sets the third interconnect to a third potential. An absolute value of a difference between the second potential and the third potential is greater than an absolute value of a difference between the first potential and the third potential. In a second operation, the controller sets the first interconnect to a fourth potential, sets the second interconnect to a fifth potential, and sets the third interconnect to a sixth potential. An absolute value of a difference between the fifth potential and the sixth potential is less than an absolute value of a difference between the fourth potential and the sixth potential.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1:
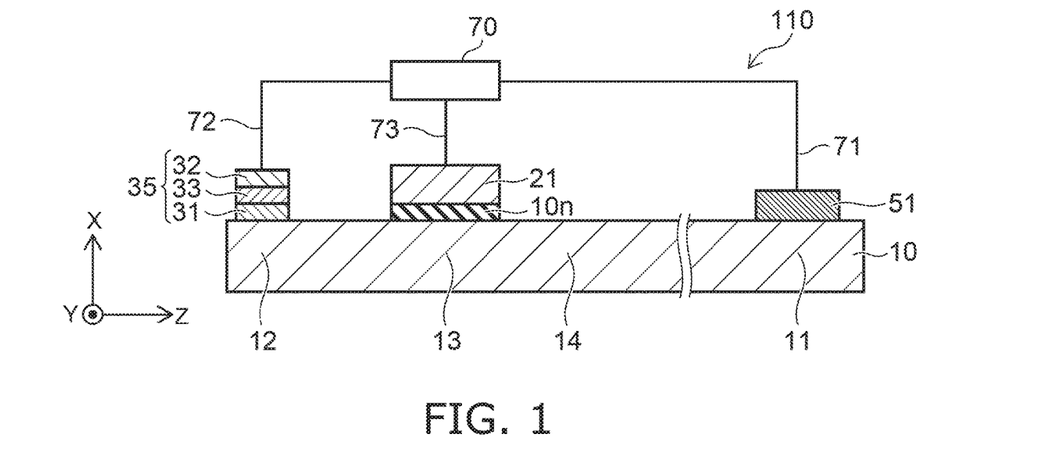
FIG. 1 is a schematic view illustrating a magnetic memory device according to a first embodiment.

FIG. 1 is a schematic view illustrating a magnetic memory device according to a first embodiment.

As shown in FIG. 1, the magnetic memory device 110 includes a magnetic portion 10, a first magnetic layer 21, a first nonmagnetic layer 10n, a first element portion 35, a first interconnect 71, a second interconnect 72, a third interconnect 73, and a controller 70.

The magnetic portion 10 includes a first portion 11, a second portion 12, and a third portion 13. The third portion 13 is positioned between the first portion 11 and the second portion 12.

In the example, the magnetic portion 10 extends along a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first nonmagnetic layer 10n is provided between the first magnetic layer 21 and the third portion 13. In the example, the direction from the third portion 13 toward the first magnetic layer 21 is aligned with the X-axis direction.

The first element portion 35 includes a first semiconductor region 31, a second semiconductor region 32, and a third semiconductor region 33. The third semiconductor region 33 is provided between the first semiconductor region 31 and the second semiconductor region 32. For example, the third semiconductor region 33 contacts the first semiconductor region 31 and the second semiconductor region 32. The first semiconductor region 31 and the second semiconductor region 32 are of a first conductivity type. The third semiconductor region 33 is of a second conductivity type.

The first conductivity type is one of an n-type or a p-type. The second conductivity type is the other of the n-type or the p-type. The first semiconductor region 31 is electrically connected to the second portion 12.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies, and a state is formable in which a current flows between the multiple conductive bodies.

The first interconnect 71 is electrically connected to the first portion 11. The second interconnect 72 is electrically connected to the second semiconductor region 32. The third interconnect 73 is electrically connected to the first magnetic layer 21.

A first electrode 51 is provided in the example. The first electrode 51 is, for example, nonmagnetic. The first electrode 51 is electrically connected to the first portion 11. The first interconnect 71 is electrically connected to the first electrode 51.

The controller 70 is electrically connected to the first interconnect 71, the second interconnect 72, and the third interconnect 73.

The magnetic portion 10 functions as a memory portion that stores information. The magnetic portion 10 includes a fourth portion 14 provided between the first portion 11 and the third portion 13. The fourth portion 14 functions as a memory portion. Information is stored in the fourth portion 14.

The first magnetic layer 21, the first nonmagnetic layer 10n, and the third portion 13 function as a write or read portion of the information. The first magnetic layer 21, the first nonmagnetic layer 10n, and the third portion 13 may function as, for example, a MTJ element. The information that is retained in the fourth portion 14 of the magnetic portion 10 is shifted through the magnetic portion 10.

The controller 70 is configured to perform the operations described below.

Figure 2:
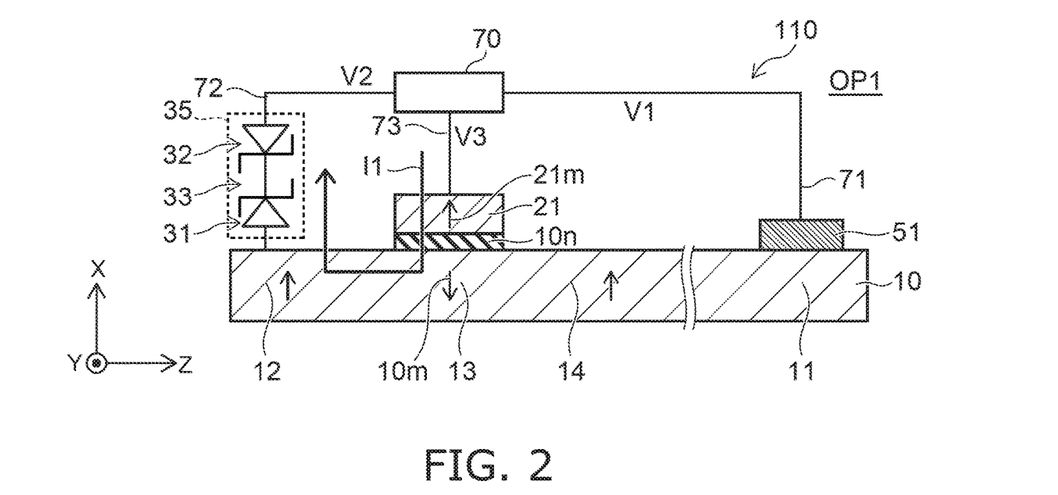
FIG. 2 is a schematic view illustrating an operation of the magnetic memory device according to the first embodiment.

FIG. 2 is a schematic view illustrating an operation of the magnetic memory device according to the first embodiment.

FIG. 2 corresponds to a first operation OP1. As shown in FIG. 2, the first element portion 35 functions as, for example, a diode pair.

In the first operation OP1 as shown in FIG. 2, the controller 70 sets the first interconnect 71 to a first potential V1, sets the second interconnect 72 to a second potential V2, and sets the third interconnect 73 to a third potential V3.

The absolute value of the difference between the second potential V2 and the third potential V3 is greater than the absolute value of the difference between the first potential V1 and the third potential V3. Because the difference between the second potential V2 and the third potential V3 is large, a first current I1 flows through a current path including the third interconnect 73 and the second interconnect 72.

For example, the first current I1 flows from the first magnetic layer 21 toward the second semiconductor region 32. Or, for example, the first current I1 flows from the second semiconductor region 32 toward the first magnetic layer 21.

The first operation OP1 is, for example, a write operation.

In the first operation OP1, the controller 70 performs a fourth operation or a fifth operation. In the fourth operation, the controller 70 sets the second potential V2 to be higher than the third potential V3. In the fifth operation, the controller 70 sets the second potential V2 to be lower than the third potential V3. The information that is written to the magnetic portion 10 in the fourth operation is different from the information written to the magnetic portion 10 in the fifth operation. For example, the information corresponds to the orientation of a magnetization 10m of the magnetic portion 10.

For example, in the first operation OP1, the information of "0" or "1" is written according to the orientation of the first current I1. For example, in the fourth operation recited above, the information of one of "0" or "1" is written. For example, in the fifth operation recited above, the other information of "0" or "1" is written.

By the writing of the information, for example, the magnetization 10m of the magnetic portion 10 becomes parallel or antiparallel to a magnetization 21m of the first magnetic layer 21. For example, the change of the magnetization 10m is due to the spin-transfer torque.

For example, the first element portion 35 has a "threshold voltage." The "threshold voltage" includes a positive threshold voltage and a negative threshold voltage. In the case where the absolute value of the positive threshold voltage is not less than the absolute value of the negative threshold voltage, the absolute value of the "threshold voltage" is taken to be the absolute value of the positive threshold voltage. In the case where the absolute value of the positive threshold voltage is less than the absolute value of the negative threshold voltage, the absolute value of the "threshold voltage" is taken to be the absolute value of the negative threshold voltage. When the voltage applied to the first element portion 35 exceeds the "threshold voltage," the first element portion 35 is switched to the conducting state. When the voltage applied to the first element portion 35 is the "threshold voltage" or less, a current substantially does not flow in the first element portion 35.

In the first operation OP1 recited above, the absolute value of the difference between the second potential V2 and the third potential V3 is greater than the absolute value of the threshold voltage of the first element portion 35. Thereby, a current flows in the first element portion 35; and the operation recited above (the write operation) is performed.

Figure 3:
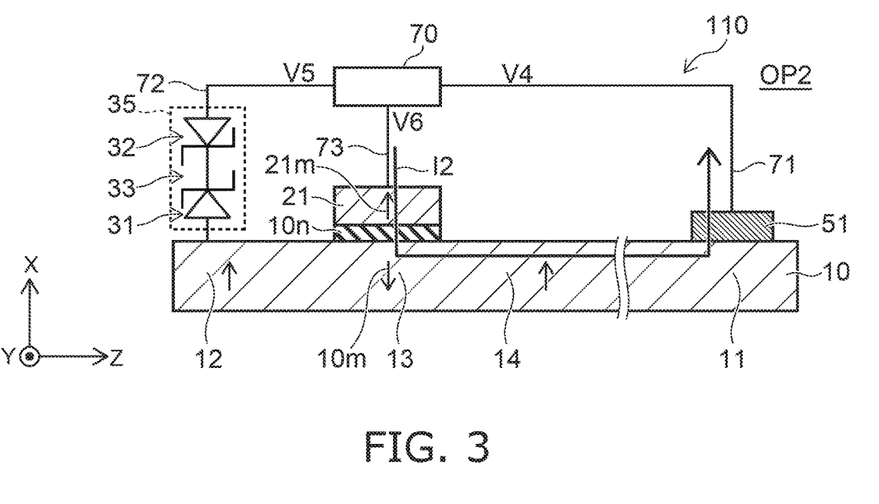
FIG. 3 is a schematic view illustrating an operation of the magnetic memory device according to the first embodiment.

FIG. 3 is a schematic view illustrating an operation of the magnetic memory device according to the first embodiment.

FIG. 3 corresponds to a second operation OP2.

In the second operation OP2 as shown in FIG. 3, the controller 70 sets the first interconnect 71 to a fourth potential V4, sets the second interconnect 72 to a fifth potential V5, and sets the third interconnect 73 to a sixth potential V6. The absolute value of the difference between the fifth potential V5 and the sixth potential V6 is less than the absolute value of the difference between the fourth potential V4 and the sixth potential V6. Because the difference between the fifth potential V5 and the sixth potential V6 is small in the second operation OP2, a current substantially does not flow in the first element portion 35. In the second operation OP2, a second current I2 flows through a current path including the first interconnect 71 and the third interconnect 73.

For example, the second current I2 flows from the third portion 13 toward the first portion 11. Or, for example, the second current I2 flows from the first portion 11 toward the third portion 13. In the second operation OP2, the domain walls of the magnetic portion 10 (the domain walls included between the first portion 11 and the third portion 13) are shifted between the first portion 11 and the third portion 13. The second operation OP2 is, for example, a shift operation.

In the second operation OP2 recited above, the absolute value of the difference between the fifth potential V5 and the sixth potential V6 is less than the absolute value of the threshold voltage of the first element portion 35. Thereby, the operation recited above (e.g., the shift operation) is performed.

For example, the absolute value of the difference between the first potential V1 and the third potential V3 is less than the absolute value of the difference between the fourth potential V4 and the sixth potential V6. Thereby, for example, the second operation OP2 (the shift operation) is not performed in the first operation OP1 (the write operation).

In the embodiment, the sixth potential V6 may be substantially the same as the third potential V3. For example, the sixth potential V6 may be not less than 0.95 times and not more than 1.05 times the third potential V3.

Figure 4:
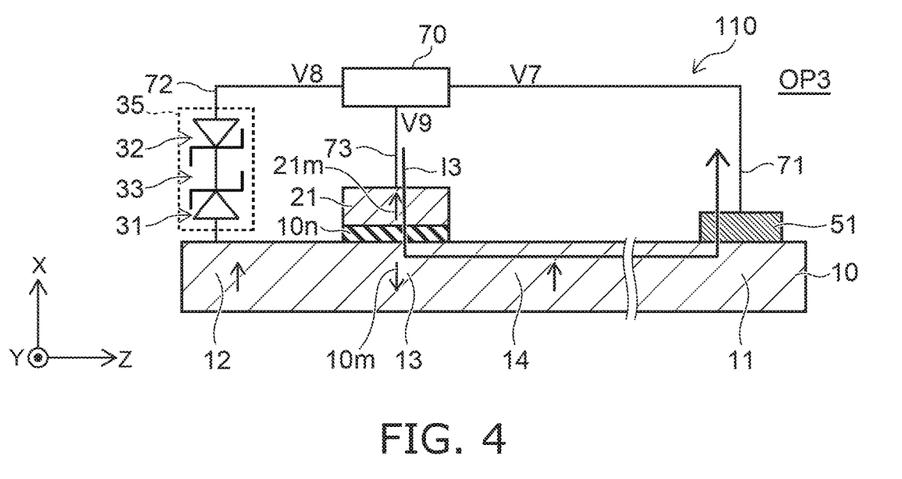
FIG. 4 is a schematic view illustrating an operation of the magnetic memory device according to the first embodiment.

FIG. 4 is a schematic view illustrating an operation of the magnetic memory device according to the first embodiment.

FIG. 4 corresponds to a third operation OP3.

In the third operation OP3 as shown in FIG. 4, the controller 70 sets the first interconnect 71 to a seventh potential V7, sets the second interconnect 72 to an eighth potential V8, and sets the third interconnect 73 to a ninth potential V9. The absolute value of the difference between the eighth potential V8 and the ninth potential V9 is less than the absolute value of the difference between the seventh potential V7 and the ninth potential V9. Because the difference between the eighth potential V8 and the ninth potential V9 is small in the third operation OP3, a current substantially does not flow in the first element portion 35. In the third operation OP3, a third current I3 flows through a current path including the first interconnect 71 and the third interconnect 73.

For example, the third current I3 flows from the third portion 13 toward the first portion 11. Or, for example, the third current I3 flows from the first portion 11 toward the third portion 13.

In the third operation OP3, the controller 70 senses a value (e.g., the value of at least one of an electrical resistance, a voltage, or a current) corresponding to the electrical resistance between the first interconnect 71 and the third interconnect 73.

The third operation OP3 is, for example, a read operation. For example, the value that corresponds to the electrical resistance between the first interconnect 71 and the third interconnect 73 changes according to the orientation of the magnetization 21m of the first magnetic layer 21 and the orientation of the magnetization 10m of the third portion 13. For example, the change is based on the magnetoresistance effect.

In the embodiment, the absolute value of the difference between the seventh potential V7 and the ninth potential V9 is less than the absolute value of the difference between the fourth potential V4 and the sixth potential V6. For example, the voltage that is applied in the read operation is lower than the voltage applied in the shift operation. The reading is performed without a shift occurring. The absolute value of the difference between the eighth potential V8 and the ninth potential V9 is less than the absolute value of the difference between the fourth potential V4 and the sixth potential V6. The reading is performed without a shift occurring.

The absolute value of the difference between the eighth potential V8 and the ninth potential V9 is less than the absolute value of the threshold voltage of the first element portion. Thereby, the operation recited above (e.g., the read operation) is performed.

In the embodiment, the ninth potential V9 may be substantially the same as the sixth potential V6. The ninth potential V9 may be substantially the same as the third potential V3. For example, the ninth potential V9 may be not less than 0.95 times and not more than 1.05 times the sixth potential V6. For example, the ninth potential V9 may be not less than 0.95 times and not more than 1.05 times the third potential V3.

In the magnetic memory device 110, stable operations can be performed. In the magnetic memory device 110, the number of interconnects is low. A magnetic memory device can be provided in which the storage density can be increased.

Second Embodiment

Figure 5:
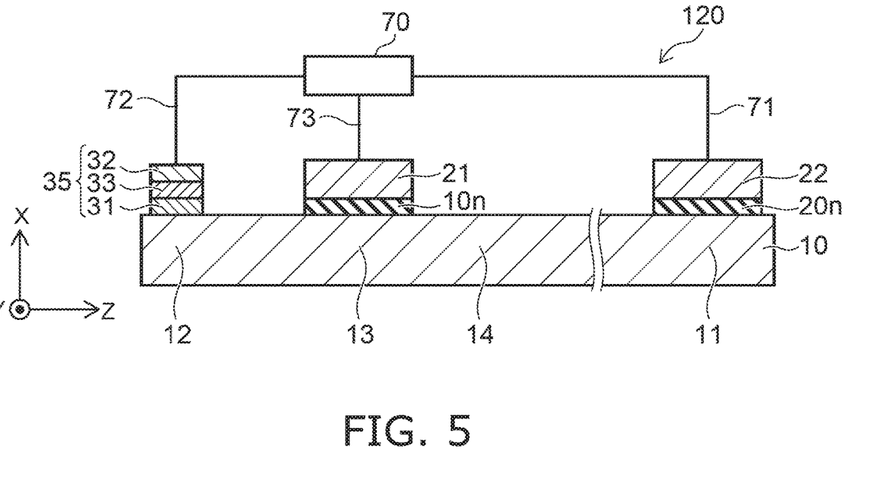
FIG. 5 is a schematic view illustrating a magnetic memory device according to a second embodiment.

FIG. 5 is a schematic view illustrating a magnetic memory device according to a second embodiment.

As shown in FIG. 5, the magnetic memory device 120 includes the magnetic portion 10, the first magnetic layer 21, the first nonmagnetic layer 10n, a second magnetic layer 22, a second nonmagnetic layer 20n, the first element portion 35, the first interconnect 71, the second interconnect 72, the third interconnect 73, and the controller 70. Other than the second magnetic layer 22 and the second nonmagnetic layer 20n, the configuration of the magnetic memory device 120 is similar to that of the magnetic memory device 110.

The second nonmagnetic layer 20n is provided between the second magnetic layer 22 and the first portion 11. The first interconnect 71 is electrically connected to the second magnetic layer 22. The second interconnect 72 is electrically connected to the second semiconductor region 32. The third interconnect 73 is electrically connected to the first magnetic layer 21. In the example as well, the controller 70 is electrically connected to the first interconnect 71, the second interconnect 72, and the third interconnect 73.

In the magnetic memory device 120, the first magnetic layer 21, the first nonmagnetic layer 10n, and the third portion 13 function as, for example, a write element. The second magnetic layer 22, the second nonmagnetic layer 20n, and the first portion 11 function as, for example, a read element.

The operations of the magnetic memory device 120 are similar to the operations of the magnetic memory device 110.

Figure 6:
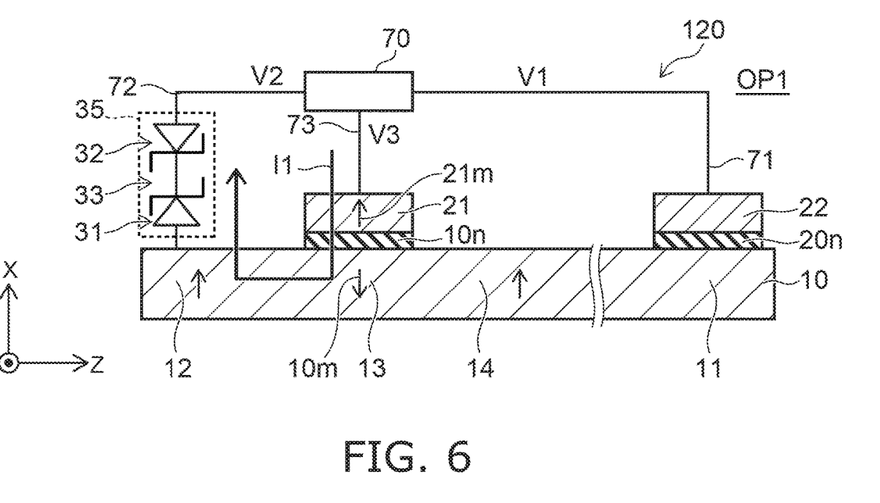
FIG. 6 is a schematic view illustrating an operation of the magnetic memory device according to the second embodiment.

FIG. 6 is a schematic view illustrating an operation of the magnetic memory device according to the second embodiment.

FIG. 6 corresponds to the first operation OP1 (e.g., the write operation). In the first operation OP1 as shown in FIG. 6, the controller 70 sets the first interconnect 71 to the first potential V1, sets the second interconnect 72 to the second potential V2, and sets the third interconnect 73 to the third potential V3. The absolute value of the difference between the second potential V2 and the third potential V3 is greater than the absolute value of the difference between the first potential V1 and the third potential V3. For example, the write operation is performed.

Figure 7:
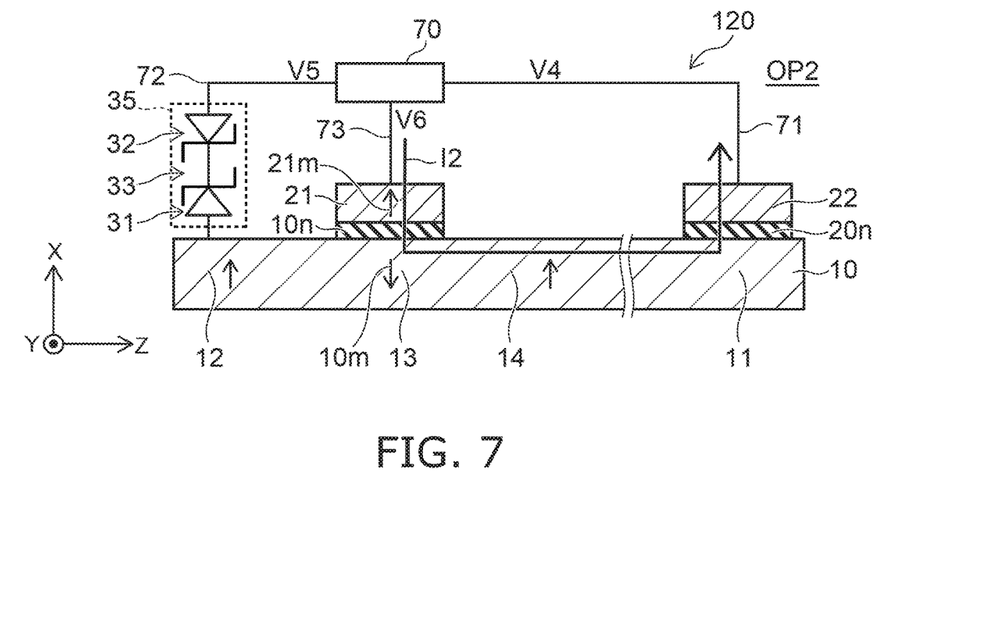
FIG. 7 is a schematic view illustrating an operation of the magnetic memory device according to the second embodiment.

FIG. 7 is a schematic view illustrating an operation of the magnetic memory device according to the second embodiment.

FIG. 7 corresponds to the second operation OP2 (e.g., the shift operation). In the second operation OP2 as shown in FIG. 7, the controller 70 sets the first interconnect 71 to the fourth potential V4, sets the second interconnect 72 to the fifth potential V5, and sets the third interconnect 73 to the sixth potential V6. The absolute value of the difference between the fifth potential V5 and the sixth potential V6 is less than the absolute value of the difference between the fourth potential V4 and the sixth potential V6. For example, the shift operation is performed.

Figure 8:
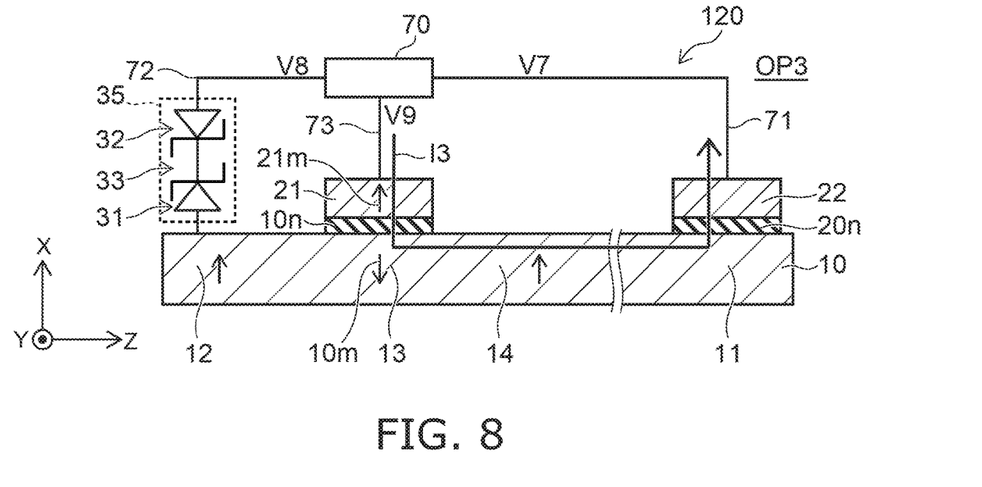
FIG. 8 is a schematic view illustrating an operation of the magnetic memory device according to the second embodiment.

FIG. 8 is a schematic view illustrating an operation of the magnetic memory device according to the second embodiment.

FIG. 8 corresponds to the third operation OP3 (e.g., the read operation). In the third operation OP3 as shown in FIG. 8, the controller 70 sets the first interconnect 71 to the seventh potential V7, sets the second interconnect 72 to the eighth potential V8, and sets the third interconnect 73 to the ninth potential V9. The absolute value of the difference between the eighth potential V8 and the ninth potential V9 is less than the absolute value of the difference between the seventh potential V7 and the ninth potential V9. For example, the absolute value of the difference between the seventh potential V7 and the ninth potential V9 is less than the absolute value of the difference between the fourth potential V4 and the sixth potential V6. By the third operation OP3, for example, the read operation is performed. In the third operation OP3, the controller 70 senses a value corresponding to the electrical resistance between the first interconnect 71 and the second interconnect 72.

The description that relates to the magnetic memory device 110 is applicable to the magnetic memory device 120. For example, the ninth potential V9 may be not less than 0.95 times and not more than 1.05 times the sixth potential V6. For example, the sixth potential V6 may be not less than 0.95 times and not more than 1.05 times the third potential V3.

In the magnetic memory device 120, stable operations can be performed. In the magnetic memory device 120, the number of interconnects is low. A magnetic memory device can be provided in which the storage density can be increased.

Third Embodiment

Figure 9:
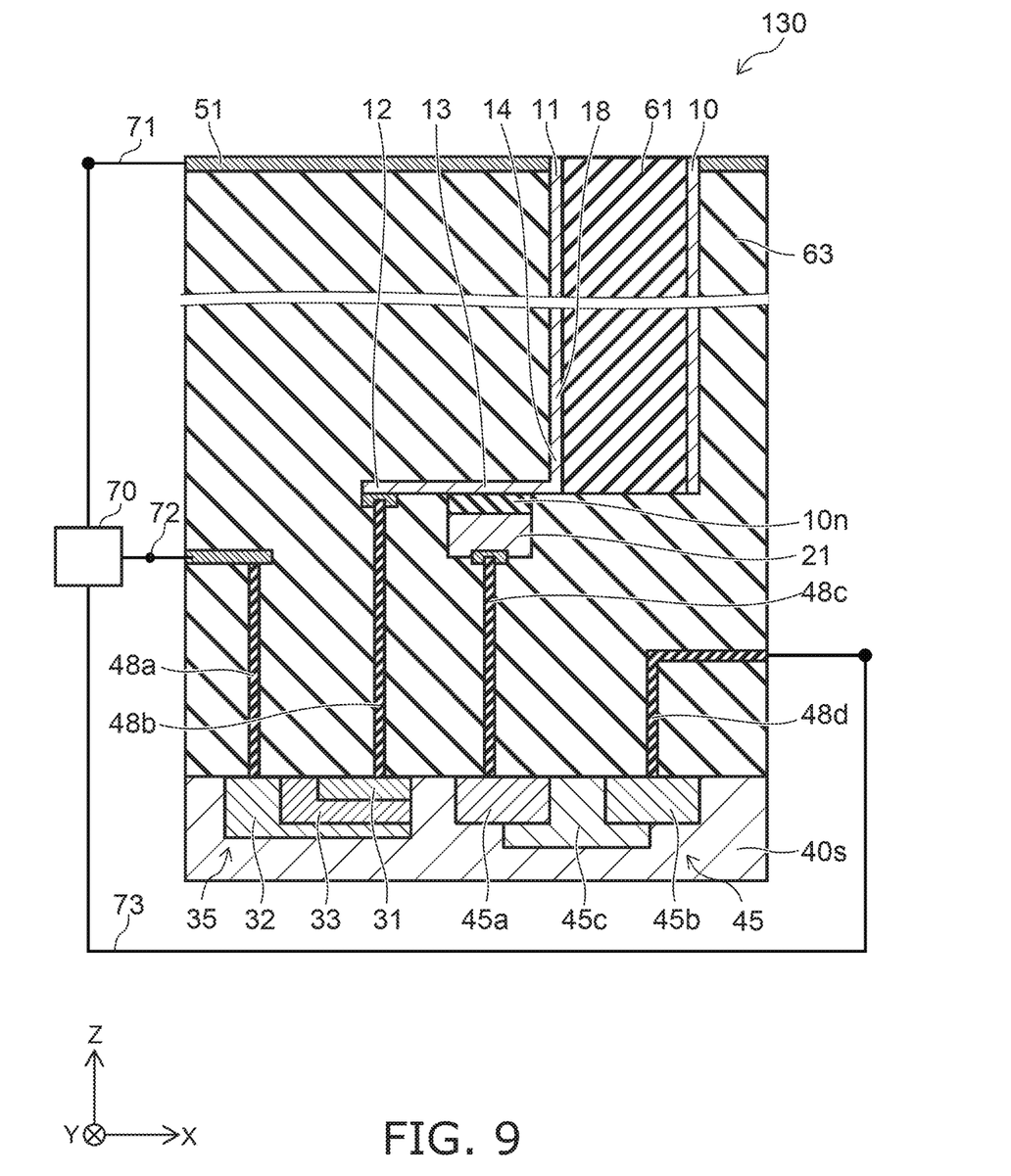
FIG. 9 is a schematic view illustrating a magnetic memory device according to a third embodiment.

FIG. 9 is a schematic view illustrating a magnetic memory device according to a third embodiment.

As shown in FIG. 9, the magnetic memory device 130 includes the magnetic portion 10, the first magnetic layer 21, the first nonmagnetic layer 10n, the first element portion 35, the first interconnect 71, the second interconnect 72, the third interconnect 73, and the controller 70.

The magnetic portion 10 includes the first portion 11, the second portion 12, and the third portion 13. The third portion 13 is positioned between the first portion 11 and the second portion 12. The first nonmagnetic layer 10n is provided between the first magnetic layer 21 and the third portion 13.

The first element portion 35 includes the first semiconductor region 31 of the first conductivity type, the second semiconductor region 32 of the first conductivity type, and the third semiconductor region 33 of the second conductivity type. A substrate 40s (e.g., a semiconductor substrate) is provided in the example. A portion of the substrate 40s is used to form these semiconductor regions. For example, the third semiconductor region 33 contacts the first semiconductor region 31 and the second semiconductor region 32.

In the magnetic memory device 130, the magnetic portion 10 includes a tubular portion 18 extending in the first direction. A portion of the tubular portion 18 is used to form the first portion 11. Another portion of the tubular portion 18 is used to form the fourth portion 14. The first direction is aligned with the Z-axis direction.

In the example, an insulating member 61 is provided inside the tubular portion 18. An insulating member 63 is provided around the magnetic portion 10.

A second direction (e.g., the X-axis direction) from the second portion 12 toward the third portion 13 crosses the first direction (the Z-axis direction). The direction from the third portion 13 toward the end portion of the fourth portion 14 is aligned with the second direction.

The first electrode 51 is provided. The first electrode 51 is electrically connected to the first portion 11.

In the example, a second element portion 45 is further provided in the substrate 40s. The second element portion 45 includes, for example, a first substrate region 45a, a second substrate region 45b, and a third substrate region 45c. The first substrate region 45a is, for example, one of a source region or a drain region. The second substrate region 45b is, for example, the other of the source region or the drain region. At least a portion of the third substrate region 45c is positioned between the first substrate region 45a and the second substrate region 45b. The second element portion 45 functions as, for example, a transistor.

The second element portion 45 is provided in a current path between the first magnetic layer 21 and the controller 70. The direction from the first element portion 35 toward the second element portion 45 crosses the first direction (the Z-axis direction).

The first magnetic layer 21 and the first substrate region 45a are electrically connected by a connection member 48c.

A connection member 48d is connected to the second substrate region 45b. The second portion 12 and the first semiconductor region 31 are electrically connected by a connection member 48b. A connection member 48a is connected to the second semiconductor region 32.

The first electrode 51 and the controller 70 are electrically connected by the first interconnect 71. The connection member 48a and the controller 70 are electrically connected by the second interconnect 72. The connection member 48d and the controller 70 are electrically connected by the third interconnect 73.

The first electrode 51 may be considered to be a portion of the first interconnect 71. The connection member 48a may be considered to be a portion of the second interconnect 72. The connection member 48d may be considered to be a portion of the third interconnect 73.

In the magnetic memory device 130, stable operations can be performed. In the magnetic memory device 130, the number of interconnects is low. A magnetic memory device can be provided in which the storage density can be increased.

In the magnetic memory device 130, the direction from the first magnetic layer 21 toward the third portion 13 is aligned with the first direction (the Z-axis direction).

The position of the third portion 13 in the second direction (e.g., the X-axis direction) is between the position of the first portion 11 in the second direction and the position of the second portion 12 in the second direction.

Figure 10:
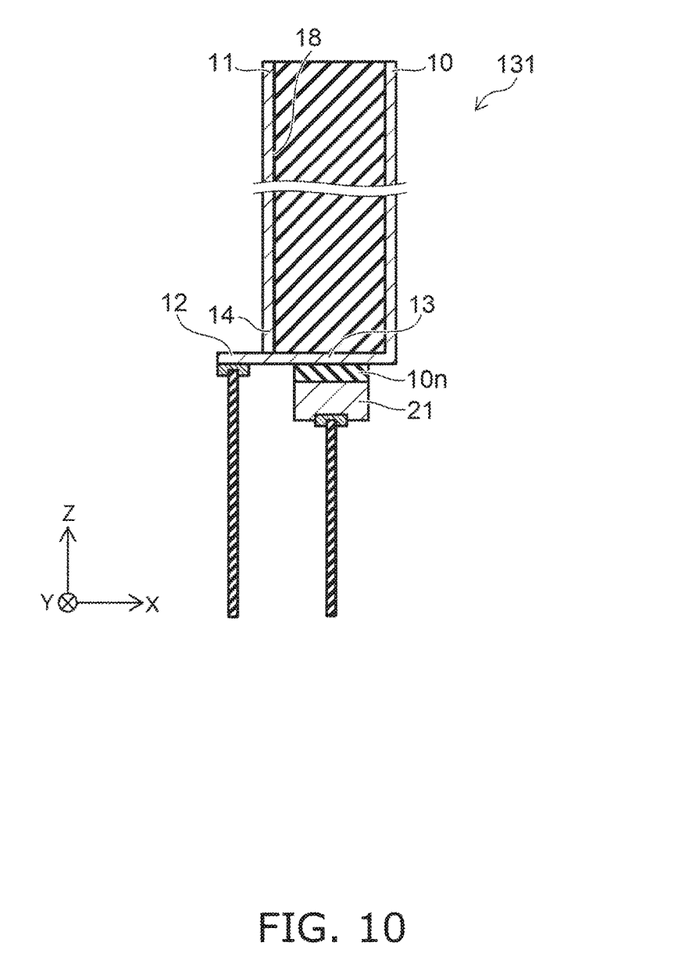
FIG. 10 is a schematic view illustrating another magnetic memory device according to the third embodiment.

FIG. 10 is a schematic view illustrating another magnetic memory device according to the third embodiment.

As shown in FIG. 10, the magnetic memory device 131 also includes the magnetic portion 10, the first magnetic layer 21, and the first nonmagnetic layer 10n. The first element portion 35, the first interconnect 71, the second interconnect 72, the third interconnect 73, and the controller 70 are provided in the magnetic memory device 131 as well. These components are not illustrated in FIG. 10.

In the magnetic memory device 131, the third portion 13 is positioned at the bottom portion of the tubular portion 18. For example, the position of at least a portion of the first portion 11 in the second direction (e.g., the X-axis direction) is between the position of the third portion 13 in the second direction and the position of the second portion 12 in the second direction.

The operations of the magnetic memory devices 130 and 131 are similar to the operations of the magnetic memory device 110 (or the magnetic memory device 120).

Examples of the materials of the embodiments will now be described.

The first nonmagnetic layer 10n includes, for example, at least one selected from the group consisting of magnesium oxide, aluminum oxide, magnesium nitride, aluminum nitride, magnesium oxynitride, and aluminum oxynitride.

Or, the first nonmagnetic layer 10n may include at least one selected from the group consisting of Au, Cu, Cr, Zn, Ga, Nb, Mo, Ru, Pd, Ag, Hf, Ta, W, Pt, and Bi.

The second nonmagnetic layer 20n includes, for example, at least one selected from the group consisting of magnesium oxide, aluminum oxide, magnesium nitride, aluminum nitride, magnesium oxynitride, and aluminum oxynitride.

The material of the second nonmagnetic layer 20n may be the same as or different from the material of the first nonmagnetic layer 10n.

At least one of the first magnetic layer 21 or the second magnetic layer 22 includes at least one selected from the group consisting of Fe, Co, and Ni.

The magnetic portion 10 may include, for example, a perpendicular magnetization film.

The magnetic portion 10 may include, for example, a rare earth-transition metal amorphous alloy. The rare earth-transition metal amorphous alloy includes, for example, an alloy including a rare earth-transition metal and a 3d transition metal. The rare earth-transition metal amorphous alloy is, for example, a ferrimagnet. The rare earth-transition metal amorphous alloy includes, for example, at least one transition metal and at least one selected from the group consisting of Tb (terbium), Dy (dysprosium), and Gd (gadolinium). The rare earth-transition metal amorphous alloy includes, for example, at least one selected from the group consisting of TbFe, TbCo, TbFeCo, DyTbFeCo, GdTbCo, and GdFeCo.

The magnetic portion 10 may include, for example, a multilayer film. The magnetic portion 10 includes, for example, at least one selected from the group consisting of a multilayer film including a Co film and a Ni film, a multilayer film including a Co film and a Pd film, and a multilayer film including a Co film and a Pt film.

The magnetic portion 10 may include, for example, an ordered alloy. The ordered alloy includes, for example, at least one selected from the group consisting of Fe, Co, and Ni, and at least one selected from the group consisting of Pt and Pd. The crystal structure of the ordered alloy is, for example, the $L_{10}$-type. The ordered alloy may include, for example, at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. The composition ratio of the ordered alloy is not limited to that recited above.

The magnetic portion 10 may include an ordered alloy and another element. The other element includes, for example, at least one selected from the group consisting of V, Mn, Cu, Cr, and Ag. By adding these elements, for example, the magnetic anisotropy energy or the saturation magnetization may be adjusted. For example, a large magnetic anisotropy energy is obtained.

The first element portion 35 and the second element portion 45 include, for example, silicon, etc.

In the embodiments, for example, a three-dimensional domain wall memory is provided. In the embodiments, the structure is simple. The patterning processes are simple. The design margin and the manufacturing margin are wide. The interconnects are simple.

The embodiments may include the following configurations (e.g., technological proposals).

Configuration 1

A magnetic memory device, comprising:

a magnetic portion including a first portion, a second portion, and a third portion between the first portion and the second portion;

a first magnetic layer;

a first nonmagnetic layer provided between the first magnetic layer and the third portion;

a first element portion including a first semiconductor region of a first conductivity type, a second semiconductor region of the first conductivity type, and a third semiconductor region of a second conductivity type, the third semiconductor region being provided between the first semiconductor region and the second semiconductor region, the first semiconductor region being electrically connected to the second portion;

a first interconnect electrically connected to the first portion;

a second interconnect electrically connected to the second semiconductor region;

a third interconnect electrically connected to the first magnetic layer; and a controller electrically connected to the first interconnect, the second interconnect, and the third interconnect, in a first operation, the controller setting the first interconnect to a first potential, setting the second interconnect to a second potential, and setting the third interconnect to a third potential, an absolute value of a difference between the second potential and the third potential being greater than an absolute value of a difference between the first potential and the third potential, in a second operation, the controller setting the first interconnect to a fourth potential, setting the second interconnect to a fifth potential, and setting the third interconnect to a sixth potential, an absolute value of a difference between the fifth potential and the sixth potential being less than an absolute value of a difference between the fourth potential and the sixth potential.

Configuration 2

A magnetic memory device, comprising:

a magnetic portion including a first portion, a second portion, and a third portion between the first portion and the second portion;

a first magnetic layer;

a first nonmagnetic layer provided between the first magnetic layer and the third portion;

a second magnetic layer;

a second nonmagnetic layer provided between the second magnetic layer and the first portion;

a first element portion including a first semiconductor region of a first conductivity type, a second semiconductor region of the first conductivity type, and a third semiconductor region of a second conductivity type, the third semiconductor region being provided between the first semiconductor region and the second semiconductor region, the first semiconductor region being electrically connected to the second portion;

a first interconnect electrically connected to the second magnetic layer;

a second interconnect electrically connected to the second semiconductor region;

a third interconnect electrically connected to the first magnetic layer; and a controller electrically connected to the first interconnect, the second interconnect, and the third interconnect, in a first operation, the controller setting the first interconnect to a first potential, setting the second interconnect to a second potential, and setting the third interconnect to a third potential, an absolute value of a difference between the second potential and the third potential being greater than an absolute value of a difference between the first potential and the third potential, in a second operation, the controller setting the first interconnect to a fourth potential, setting the second interconnect to a fifth potential, and setting the third interconnect to a sixth potential, an absolute value of a difference between the fifth potential and the sixth potential being less than an absolute value of a difference between the fourth potential and the sixth potential.

Configuration 3

The magnetic memory device according to Configuration 1 or 2, wherein in a third operation, the controller sets the first interconnect to a seventh potential, sets the second interconnect to an eighth potential, and sets the third interconnect to a ninth potential, an absolute value of a difference between the eighth potential and the ninth potential being less than an absolute value of a difference between the seventh potential and the ninth potential, and the absolute value of the difference between the seventh potential and the ninth potential is less than the absolute value of the difference between the fourth potential and the sixth potential.

Configuration 4

The magnetic memory device according to Configuration 3, wherein the ninth potential is not less than 0.95 times and not more than 1.05 times the sixth potential.

Configuration 5

The magnetic memory device according to Configuration 3 or 4, wherein the controller senses, in the third operation, a value corresponding to an electrical resistance between the first interconnect and the second interconnect.

Configuration 6

The magnetic memory device according to any one of Configurations 3 to 5, wherein the absolute value of the difference between the eighth potential and the ninth potential is less than the absolute value of the difference between the fourth potential and the sixth potential.

Configuration 7

The magnetic memory device according to any one of Configurations 3 to 6, wherein the absolute value of the difference between the eighth potential and the ninth potential is less than an absolute value of a threshold voltage of the first element portion.

Configuration 8

The magnetic memory device according to any one of Configurations 1 to 6, wherein the absolute value of the difference between the second potential and the third potential is greater than an absolute value of a threshold voltage of the first element portion.

Configuration 9

The magnetic memory device according to Configuration 8, wherein the absolute value of the difference between the fifth potential and the sixth potential is less than the absolute value of the threshold voltage.

Configuration 10

The magnetic memory device according to any one of Configurations 1 to 8, wherein the absolute value of the difference between the first potential and the third potential is less than the absolute value of the difference between the fourth potential and the sixth potential.

Configuration 11

The magnetic memory device according to any one of Configurations 1 to 10, wherein in the first operation, the controller performs a fourth operation of setting the second potential to be higher than the third potential, or the controller performs a fifth operation of setting the second potential to be lower than the third potential, and information written to the magnetic portion in the fourth operation is different from information written to the magnetic portion in the fifth operation.

Configuration 12

The magnetic memory device according to any one of Configurations 1 to 11, wherein a domain wall of the magnetic portion is shifted between the first portion and the third portion in the second operation.

Configuration 13

The magnetic memory device according to any one of Configurations 1 to 10, wherein the sixth potential is not less than 0.95 times and not more than 1.05 times the third potential.

Configuration 14

The magnetic memory device according to any one of Configurations 1 to 13, wherein
the magnetic portion includes a tubular portion extending in a first direction, and
a second direction from the second portion toward the third portion crosses the first direction.

Configuration 15

The magnetic memory device according to Configuration 14, wherein a direction from the first magnetic layer toward the third portion is aligned with the first direction.

Configuration 16

The magnetic memory device according to Configuration 14 or 15, wherein a position of the third portion in the second direction is between a position of the first portion in the second direction and a position of the second portion in the second direction.

Configuration 17

The magnetic memory device according to Configuration 14 or 15, wherein a position of at least a portion of the first portion in the second direction is between a position of the third portion in the second direction and a position of the second portion in the second direction.

Configuration 18

The magnetic memory device according to Configuration 17, wherein the third portion is positioned at a bottom portion of the tubular portion.

Configuration 19

The magnetic memory device according to Configurations 1 to 18, further comprising a second element portion provided in a current path between the first magnetic layer and the controller,
a direction from the first element portion toward the second element portion crossing the first direction.

Configuration 20

The magnetic memory device according to Configurations 1 to 19, wherein the third semiconductor region contacts the first semiconductor region and the second semiconductor region.

According to the embodiments, a magnetic memory device can be provided in which the storage density can be increased.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory device such as the magnetic portion, the magnetic layer, the nonmagnetic layer, the element portion, the semiconductor region, the interconnect, the electrode, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a magnetic portion including a first portion, a second portion, and a third portion between the first portion and the second portion;
   a first magnetic layer;
   a first nonmagnetic layer provided between the first magnetic layer and the third portion;
   a first element portion including a first semiconductor region of a first conductivity type, a second semiconductor region of the first conductivity type, and a third semiconductor region of a second conductivity type, the third semiconductor region being provided between the first semiconductor region and the second semiconductor region, the first semiconductor region being electrically connected to the second portion;
   a first interconnect electrically connected to the first portion;
   a second interconnect electrically connected to the second semiconductor region;
   a third interconnect electrically connected to the first magnetic layer; and
   a controller electrically connected to the first interconnect, the second interconnect, and the third interconnect,
   in a first operation, the controller setting the first interconnect to a first potential, setting the second interconnect to a second potential, and setting the third interconnect to a third potential, an absolute value of a difference between the second potential and the third potential being greater than an absolute value of a difference between the first potential and the third potential,
   in a second operation, the controller setting the first interconnect to a fourth potential, setting the second interconnect to a fifth potential, and setting the third interconnect to a sixth potential, an absolute value of a difference between the fifth potential and the sixth potential being less than an absolute value of a difference between the fourth potential and the sixth potential.

2. The device according to claim 1, wherein
   in a third operation, the controller sets the first interconnect to a seventh potential, sets the second interconnect to an eighth potential, and sets the third interconnect to a ninth potential, an absolute value of a difference between the eighth potential and the ninth potential being less than an absolute value of a difference between the seventh potential and the ninth potential, and the absolute value of the difference between the seventh potential and the ninth potential is less than the absolute value of the difference between the fourth potential and the sixth potential.

3. The device according to claim 2, wherein the ninth potential is not less than 0.95 times and not more than 1.05 times the sixth potential.

4. The device according to claim 2, wherein the controller senses, in the third operation, a value corresponding to an electrical resistance between the first interconnect and the second interconnect.

5. The device according to claim 2, wherein the absolute value of the difference between the eighth potential and the ninth potential is less than the absolute value of the difference between the fourth potential and the sixth potential.

6. The device according to claim 2, wherein the absolute value of the difference between the eighth potential and the ninth potential is less than an absolute value of a threshold voltage of the first element portion.

7. The device according to claim 1, wherein the absolute value of the difference between the second potential and the third potential is greater than an absolute value of a threshold voltage of the first element portion.

8. The device according to claim 7, wherein the absolute value of the difference between the fifth potential and the sixth potential is less than the absolute value of the threshold voltage.

9. The device according to claim 1, wherein the absolute value of the difference between the first potential and the third potential is less than the absolute value of the difference between the fourth potential and the sixth potential.

10. The device according to claim 1, wherein
in the first operation, the controller performs a fourth operation of setting the second potential to be higher than the third potential, or the controller performs a fifth operation of setting the second potential to be lower than the third potential, and
information written to the magnetic portion in the fourth operation is different from information written to the magnetic portion in the fifth operation.

11. The device according to claim 1, wherein a domain wall of the magnetic portion is shifted between the first portion and the third portion in the second operation.

12. The device according to claim 1, wherein the sixth potential is not less than 0.95 times and not more than 1.05 times the third potential.

13. The device according to claim 1, wherein
the magnetic portion includes a tubular portion extending in a first direction, and
a second direction from the second portion toward the third portion crosses the first direction.

14. The device according to claim 13, wherein a direction from the first magnetic layer toward the third portion is aligned with the first direction.

15. The device according to claim 13, wherein a position of the third portion in the second direction is between a position of the first portion in the second direction and a position of the second portion in the second direction.

16. The device according to claim 13, wherein a position of at least a portion of the first portion in the second direction is between a position of the third portion in the second direction and a position of the second portion in the second direction.

17. The device according to claim 16, wherein the third portion is positioned at a bottom portion of the tubular portion.

18. The device according to claim 1, further comprising a second element portion provided in a current path between the first magnetic layer and the controller,
a direction from the first element portion toward the second element portion crossing the first direction.

19. The device according to claim 1, wherein the third semiconductor region contacts the first semiconductor region and the second semiconductor region.

20. A magnetic memory device, comprising:
a magnetic portion including a first portion, a second portion, and a third portion between the first portion and the second portion;
a first magnetic layer;
a first nonmagnetic layer provided between the first magnetic layer and the third portion;
a second magnetic layer;
a second nonmagnetic layer provided between the second magnetic layer and the first portion;
a first element portion including a first semiconductor region of a first conductivity type, a second semiconductor region of the first conductivity type, and a third semiconductor region of a second conductivity type, the third semiconductor region being provided between the first semiconductor region and the second semiconductor region, the first semiconductor region being electrically connected to the second portion;
a first interconnect electrically connected to the second magnetic layer;
a second interconnect electrically connected to the second semiconductor region;
a third interconnect electrically connected to the first magnetic layer; and
a controller electrically connected to the first interconnect, the second interconnect, and the third interconnect,
in a first operation, the controller setting the first interconnect to a first potential, setting the second interconnect to a second potential, and setting the third interconnect to a third potential, an absolute value of a difference between the second potential and the third potential being greater than an absolute value of a difference between the first potential and the third potential,
in a second operation, the controller setting the first interconnect to a fourth potential, setting the second interconnect to a fifth potential, and setting the third interconnect to a sixth potential, an absolute value of a difference between the fifth potential and the sixth potential being less than an absolute value of a difference between the fourth potential and the sixth potential.

* * * * *